(12) United States Patent
Sato et al.

(10) Patent No.: US 8,733,995 B2
(45) Date of Patent: May 27, 2014

(54) LIGHT SOURCE DEVICE WITH REDUCED OPTICAL PART CLOUDING

(75) Inventors: Yukio Sato, Tokyo (JP); Mitoru Yabe, Tokyo (JP); Toru Yoshihara, Tokyo (JP); Yasuyuki Nakagawa, Tokyo (JP); Hiroshi Kurokawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 300 days.

(21) Appl. No.: 12/857,701

(22) Filed: Aug. 17, 2010

(65) Prior Publication Data

US 2011/0044069 A1 Feb. 24, 2011

(30) Foreign Application Priority Data

Aug. 18, 2009 (JP) ................................. 2009-189087

(51) Int. Cl.
- *G02B 6/00* (2006.01)
- *G02B 6/42* (2006.01)
- *F21V 5/00* (2006.01)
- *B26D 7/27* (2006.01)

(52) U.S. Cl.
USPC ....................... 362/551; 362/555; 362/311.01

(58) Field of Classification Search
USPC ................................................. 362/551, 555
See application file for complete search history.

(56) References Cited

U.S. PATENT DOCUMENTS

| | | | |
|---|---|---|---|
| 4,355,323 A | 10/1982 | Kock | |
| 5,207,505 A | 5/1993 | Naraki et al. | |
| 5,604,831 A | 2/1997 | Dittman et al. | |
| 5,888,449 A | 3/1999 | Kennedy et al. | |
| 5,906,429 A | 5/1999 | Mori et al. | |
| 6,005,711 A * | 12/1999 | Mai et al. | 359/424 |
| 6,224,248 B1 * | 5/2001 | Chiba | 362/580 |
| 6,491,420 B1 * | 12/2002 | Scifres | 362/553 |
| 6,740,893 B1 | 5/2004 | Tanabe | |
| 6,903,799 B2 * | 6/2005 | Tsuji et al. | 355/30 |
| 7,585,418 B2 * | 9/2009 | Mori et al. | 216/12 |

(Continued)

FOREIGN PATENT DOCUMENTS

| | | |
|---|---|---|
| AU | 723572 B2 | 8/2000 |
| CN | 1430012 A | 7/2003 |

(Continued)

OTHER PUBLICATIONS

Machine English translation of JP2000106017 to Murakoshi et al.*

(Continued)

*Primary Examiner* — Sikha Roy
(74) *Attorney, Agent, or Firm* — Birch, Stewart, Kolasch & Birch, LLP.

(57) ABSTRACT

An objective is to provide a light source device having a light emission source such as a semiconductor laser (LD), an LED and a lamp, and an optical part such as a lens and a fiber for transmitting, transferring and light-focusing, in which, by controlling the amount of sulfate ions inside the device at a low level, adhesion of ammonium sulfate to the optical part can be prevented. The light source device includes a light source for emitting light, an optical part for processing light emitted from the light source, and a housing in which the optical part is housed, or to which the optical part is mounted, and the housing is formed by machining material that includes no sulfur component, and the material is exposed on the surface thereof.

9 Claims, 12 Drawing Sheets

(56) References Cited

U.S. PATENT DOCUMENTS

| | | |
|---|---|---|
| 2002/0003819 A1* | 1/2002 | Kimura et al. ............... 372/36 |
| 2002/0051126 A1* | 5/2002 | Ogata ............................ 355/53 |
| 2002/0154855 A1* | 10/2002 | Rose et al. .................... 385/24 |
| 2003/0043586 A1 | 3/2003 | Sagal et al. |
| 2003/0117810 A1 | 6/2003 | Nakazawa et al. |
| 2004/0190837 A1* | 9/2004 | Morioka ........................ 385/93 |
| 2004/0233401 A1 | 11/2004 | Irie |
| 2005/0018440 A1* | 1/2005 | Koike et al. ................. 362/487 |
| 2006/0062009 A1 | 3/2006 | Ono et al. |
| 2006/0092530 A1* | 5/2006 | Kobayashi ................... 359/811 |
| 2006/0222042 A1* | 10/2006 | Teramura et al. ............ 372/101 |
| 2006/0291215 A1* | 12/2006 | Shirai et al. ................. 362/341 |
| 2007/0139948 A1* | 6/2007 | Rawlings et al. ............ 362/548 |
| 2008/0037270 A1* | 2/2008 | Kagiyama .................... 362/510 |
| 2008/0267563 A1* | 10/2008 | Miyanari et al. ............. 385/33 |
| 2009/0088020 A1 | 4/2009 | Abe et al. |
| 2009/0103923 A1 | 4/2009 | Hosomi et al. |
| 2009/0286170 A1* | 11/2009 | Shirasaki ........................ 430/5 |

FOREIGN PATENT DOCUMENTS

| | | | |
|---|---|---|---|
| CN | 1519997 A | | 8/2004 |
| CN | 1561528 A | | 1/2005 |
| CN | 1749641 A | | 3/2006 |
| CN | 101442185 A | | 5/2009 |
| JP | 6-4451 U | | 1/1986 |
| JP | 61-4450 U | | 1/1986 |
| JP | 61-117434 A | | 6/1986 |
| JP | 03-107411 A | | 5/1991 |
| JP | 04-097305 A | | 3/1992 |
| JP | 05-343774 A | | 12/1993 |
| JP | 06-226449 A | | 8/1994 |
| JP | 07-127972 A | | 5/1995 |
| JP | 08-041530 A | | 2/1996 |
| JP | 11-050205 A | | 2/1999 |
| JP | 2000106017 A | * | 4/2000 |
| JP | 2000-160233 A | | 6/2000 |
| JP | 3266156 B2 | | 3/2002 |
| JP | 3309867 B2 | | 7/2002 |
| JP | 2003-031890 A | | 1/2003 |
| JP | 3448670 B2 | | 9/2003 |
| JP | 2003-306798 A | | 10/2003 |
| JP | 2004-253783 A | | 9/2004 |
| JP | 2004-259786 A | | 9/2004 |
| JP | 2005-116641 A | | 4/2005 |
| JP | 2009-083563 A | | 4/2009 |
| WO | WO 02/067475 A2 | | 8/2002 |
| WO | WO 03/021623 A1 | | 3/2003 |

OTHER PUBLICATIONS

Anonymous, "Acetone", Wikipedia, the free encyclopedia, XP-002673946, Retrieved from the Internet on Apr. 16, 2012: URL: [http://web.archive.org/web/20090320150052/http://en.wikipedia.org/wiki/acetone], Mar. 20, 2009, 5 pages.

Kopeliovich, "Halogenated Solvents", SubsTech Substances & Technologies, XP-002673945, Retrieved from the Internet on Apr. 16, 2012: URL: [http://www.substech.com/dokuwiki/doku.php?id=halogenated_solvents], May 16, 2009, 4 pages.

* cited by examiner

FIG. 2

| | specification | Number of samples | $SO_4^{2-}$ [μg/piece] | $NH_4^+$ [μg/piece] | Amount of sulfur component in constituent part [ppm] |
|---|---|---|---|---|---|
| Comparison example 1 | Machined brass+Nickel plating | n=2 | 0.38~0.46 | 0.23~0.30 | 30 or less |
| Practical example 1 | Machined brass+Nickel plating Unplated | n=3 | Less than 0.05 | 0.06~0.10 | 30 or less |
| Comparison example 2 | Machined SUS303 | n=5 | 62~87 | Less than 0.05~0.17 | >>30 |
| Comparison example 3 | Machined SUS304 | n=2 | 1.8~1.9 | 0.12~0.16 | >>30 |

FIG. 3

| | specification | Number of samples | $SO_4^{2-}$ [μg/piece] | $NH_4^+$ [μg/piece] |
|---|---|---|---|---|
| Comparison example 4 | Machined brass+Nickel plating | n=12 | 0.12~12 | Less than 0.05~4.6 |
| Practical example 2 | Machined brass+Nickel plating Unplated | n=8 | Less than 0.05~0.07 | 0.06~0.12 |

FIG. 4

| | specification | Number of samples | SO$_4^{2-}$ [μg/piece] | NH$_4^+$ [μg/piece] |
|---|---|---|---|---|
| Comparison example 5 | aluminum die casting | n=5 | 0.28~0.10 | 0.58~0.80 |
| Practical example 3 | Machined aluminum | n=4 | Less than 0.1 | 0.42~0.64 |

FIG. 5

| | Step | specification | Number of samples | $SO_4^{2-}$ [μg/piece] | $NH_4^+$ [μg/piece] |
|---|---|---|---|---|---|
| Comparison example 6 | 1 | Just after machining | n=2 | 2.2~2.8 | 0.12~0.14 |
| Comparison example 7 | 2 | Washing with chlorinated solvent | n=2 | 0.11~0.15 | 0.15~0.17 |
| Practical example 4 | 3 | Washing with acetone | n=2 | Less than 0.05~0.08 | 0.06~0.11 |

LIGHT SOURCE DEVICE WITH REDUCED OPTICAL PART CLOUDING

BACKGROUND OF THE INVENTION

1. Field of the Invention

The present invention relates to a light source device in which clouding of optical parts is prevented, and to a method of producing the light source device.

2. Description of the Related Art

There has been a conventional light source device in which laser light emitted from a semiconductor laser element is transmitted through an optical fiber. In order to guide to the optical fiber the laser light emitted from the semiconductor laser element, the laser light emitted from the semiconductor laser element is first converted into parallel light using an optical lens, and then the parallel light is guided into the optical fiber by focusing using a condenser lens having a suitable focal length fitting with the optical-fiber characteristics (fiber diameter, NA (numerical aperture)). In this system, the energy level per photon under an ultra-violet-wavelength region (shorter than 400 nm) is an order (higher than 3 eV) equivalent to that of general chemical bonding. Because such short-wavelength light easily excites and dissociates impurities in air, the impurities excited and dissociated by the light adhere to neighboring optical parts, and thereby their transmittance is decreased; as a result, a harmful influence such as disorder of the optical wavefront of the laser light incident on an optical part is exerted. Such a problem has been first extensively highlighted in an industrial application, specifically in a light exposure device, for printing a fine circuit pattern on a silicon substrate, introduced in a production process of an ultra-large-scale integrated circuit (ULSI). In this device, in response to miniaturization of circuit patterns, light sources, outputting short-wavelength light, such as an i-line of a mercury lamp (wavelength of 365 nm), a KrF laser (that of 248 nm), and an ArF laser (that of 193 nm) have been applied one after another. In this system, ammonium sulfate (($NH_4$)$_2SO_4$) as a typical product is known to be produced by the following reaction equation using material such as sulfur dioxide ($SO_2$) and ammonia ($NH_3$) present in trace amounts in air being reacted with oxygen ($O_2$) and water vapor ($H_2O$) in air.

$$2SO_2 + 2H_2O + O_2 \rightarrow 2H_2SO_4 \quad (1)$$

$$2NH_3 + H_2SO_4 \rightarrow (NH_4)_2SO_4 \quad (2)$$

Ammonium sulfate produced causes transmittance decrease of the optical parts due to adhering to the optical parts.

Ultra-violet light is considered to activate $SO_2$ in the reaction system indicated by the above equation (1), to accelerate the reaction, and the shorter the wavelength of the source light, the more remarkably the influence exerts on the speed of the product adhering to the optical parts.

Methods of improving the problems have been disclosed. A method is disclosed, for example, in Japanese Patent Publication No. 3266156 (page 4, FIG. 1), which is also published as U.S. Pat. No. 5,207,505, in which, by setting the temperature of an optical lens at higher than 120 degrees C. that is the sublimation temperature (decomposition temperature) of ammonium sulfate, the adhesion of ammonium sulfate is prevented. A method is disclosed, for example, in Japanese Patent Publication No. 3309867 (page 8, FIG. 1) in which, by using a reflection unit whose reflectance is set smaller with respect to light activating sulfur dioxide, the activation of sulfur dioxide is prevented. A method is disclosed, for example, in Japanese Patent Publication No. 3448670 (page 11, FIG. 1) in which, by forming an air curtain by flowing, for example, dry air or inert gas ($N_2$, He, Ne or Ar, etc.) at the front of an optical part, sulfur dioxide, ammonia, water vapor being gaseous components constituting a reaction system are removed. A method is disclosed, for example, in Japanese Patent Application Publication Laid-Open No. 2004-259786 (page 9, FIG. 1), which is also published as United States Patent Application Publication No. 2004/0233401, in which, by devising a method of flowing the gas in the improvement method disclosed in Japanese Patent Publication No. 3448670, an impurity gas around the optical part is effectively removed. A method is disclosed, for example, in Japanese Patent Application Publication Laid-Open No. 2004-253783 (page 13, FIG. 1) in which, in an optical system for guiding laser light into an optical fiber, by hermetic sealing a semiconductor laser element and an optical lens for collimating the light, the semiconductor element and an optical part are isolated from the impurity gas. Moreover, a method is disclosed, for example, in Japanese Patent Application Publication Laid-Open No. 2003-306798 (page 9, FIG. 1) in which, regarding black plating treated on a lens tube for reducing scattered light, in order to reduce the amount of sulfate ions included in plating solution, by controlling a hot-water-washing time while monitoring the sulfate ions, the sulfate ions are controlled within a specified amount.

Various methods are disclosed in the above Patent Documents for preventing the clouding of the optical parts; however, measures have not been taken against the sulfur component included as an ingredient in the parts constituting the light source. However, the sulfur component included as an ingredient in the parts flows out of the parts, as described in later test results. In the devices disclosed in the above Patent Documents, it has not been considered that, due to the sulfur component flowing out of the parts, the amount of sulfate ions increases in the devices, and resultantly ammonium sulfate becomes easy to adhere to the optical parts.

SUMMARY OF THE INVENTION

An objective of the present invention is to provide a light source device in which, by controlling the amount of sulfate ions inside the device at a low level, adhesion of ammonium sulfate to its optical parts can be prevented.

A light source device according to an aspect of the present invention includes a light source for emitting light, an optical part for processing light emitted from the light source, and a housing in which the optical part is housed, or to which the optical part is mounted, the housing being formed by machining material that includes no sulfur component, and the material being configured to be exposed on the surface thereof.

According to the aspect of the present invention, by controlling the amount of sulfate ions inside the device at the low level, the adhesion of ammonium sulfate to its optical parts can be prevented.

Other aspects and advantages of the invention will become more apparent from the following detailed description, taken in conjunction with the attached drawings.

BRIEF DESCRIPTION OF DRAWINGS

FIG. 2 is a table for explaining differences among materials in the amounts of ions adhering on receptacles;

FIG. 3 is a table for explaining differences between materials in the amounts of ions adhering on ferrules;

FIG. 4 is a table for explaining difference between materials in the amounts of ions adhering on the inner face of a second lens tube;

FIG. 5 is a table for explaining the amounts of ions adhering on the ferrules at respective washing processes;

DETAILED DESCRIPTION OF THE PREFERRED EMBODIMENTS

In the following description, numerous specific details are set forth in order to provide a thorough understanding of the present invention. It will be apparent, however, to one skilled in the art that the present invention may be practiced without some or all of these specific details.

Embodiment 1

Figure 1:
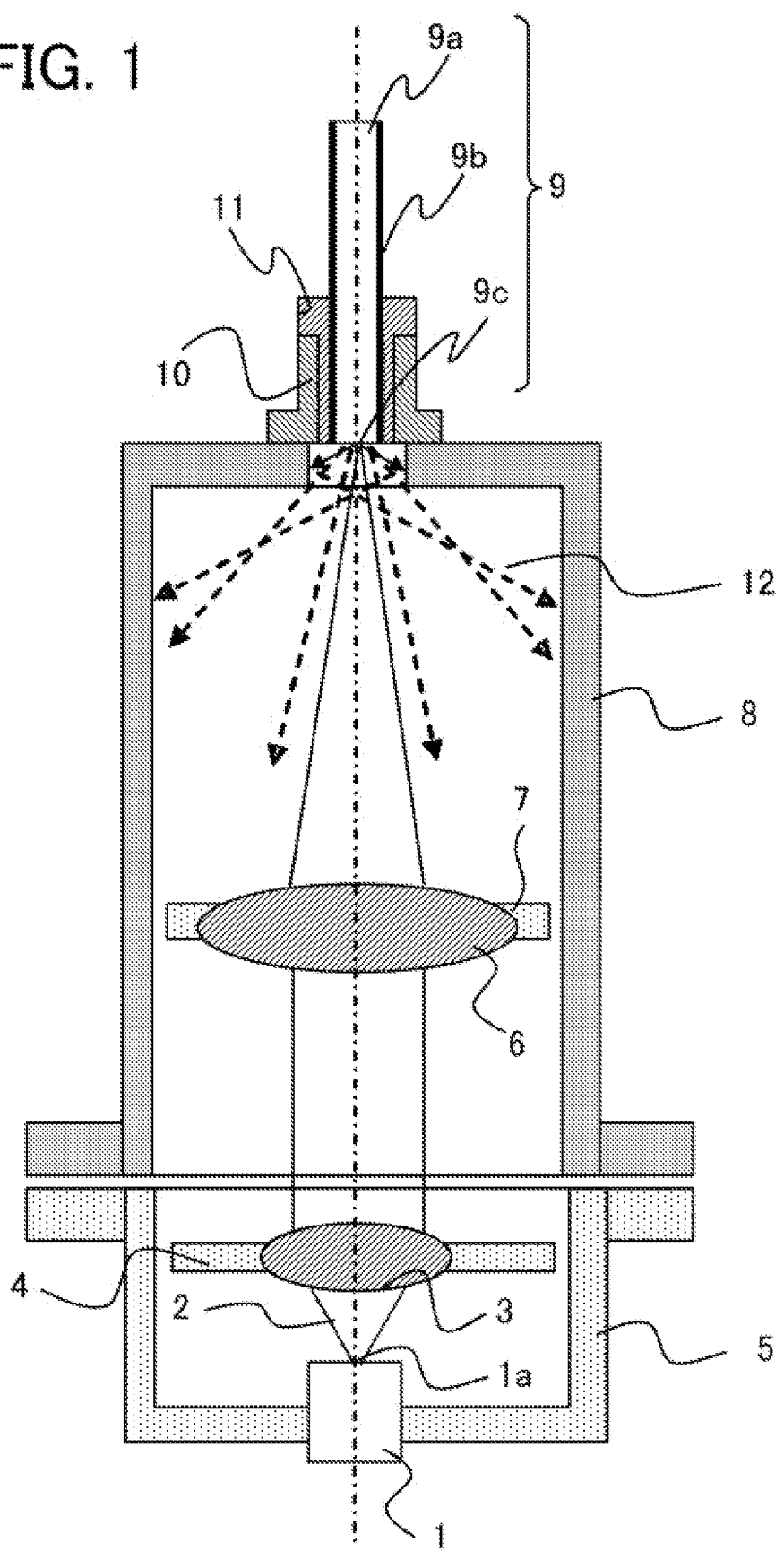
FIG. 1 is a configuration view illustrating a light source device according to Embodiment 1 of the present invention.

FIG. 1 is a configuration view illustrating a light source device according to Embodiment 1 of the present invention. In a semiconductor laser element (hereinafter, referred to as an LD) 1 as a light source, laser light 2 is emitted from an exit aperture 1a thereof. A first lens 3 collimates the laser light 2. The first lens 3 is a collimating unit for collimating light emitted from the light source. A first holder 4 supports the first lens 3. The LD 1 and the first lens 3, etc. are housed in a first lens tube 5. A second lens 6 focuses the laser light. The second lens 6 is a focusing unit for focusing the collimated light. A second holder 7 supports the second lens 6. The second lens 6 is housed in a second lens tube 8. An optical fiber 9 is configured with a core portion 9a and a clad portion 9b, and guides laser light inputted from an incident end face 9c. A receptacle 10 fixes a light receiving position of the optical fiber 9. A ferrule 11 is mounted to an end of the optical fiber 9, and inserted into the receptacle 10, which fixes the optical fiber 9. A portion of the laser light focused by the second lens 6 is reflected and scattered at the incident end face 9c and the receptacle 10, etc., and then changes to reflected/scattered light 12. The second lens tube 8 is a housing in which an optical part is housed. The housing may be such one to which the optical part is mounted.

In the above configuration, at least the second lens tube 8 is configured of a material element including no sulfur component in the material element (configured of metal material such as aluminum, brass or titanium, ceramic material, or resin material such as ABS resin, nylon, polycarbonate, phenol resin or poly(vinyl chloride), which include no sulfur component as an impurity). Here, the meaning of "including no sulfur component" is that the content weight ratio of the sulfur component in the material element is 30 ppm or lower. Whether the weight ratio of the sulfur component in the material element is 30 ppm or lower can be checked, for example, by an ion chromatography analysis after the material element has been boiled for 4 hours at a temperature of 120 degrees C. in pure water under pressure of 0.2 Mpa.

Next, an operation of the light source device is explained. The laser light 2 emitted from the LD 1 is converted to that approximately collimated due to the exit aperture 1a of the LD 1 being arranged at the focus position of the first lens 3. The collimated laser light 2 is focused by the second lens 6. By installing the incident end face 9c of the optical fiber 9 in the proximity of the focal point of the second lens 6, the laser light 2 is guided into the optical fiber 9. The laser light inputted into the optical fiber 9 is propagated through the core portion 9a while being totally reflected at the interface with the clad 9b. Here, the receptacle 10 is fixed to the second lens tube 8. Due to the ferrule 11 being inserted into and fixed to the receptacle 10, the optical fiber 9 is fixed so that the incident end face is positioned in the proximity of the focal point of the second lens 6.

In the light source device as described above, the laser light 2 is focused in the proximity of the incident end face 9c; however, a portion, whose light diameter extends wider than the incident end face 9c, of the laser light directly irradiates the receptacle 10 and the ferrule 11, etc. as leakage light. Relatively high-intensity reflection and scattering light from the receptacle 10 and the ferrule 11, etc., also irradiates the surfaces of parts positioned around the incident end face 9c.

If sulfate ion ($SO_4^{2-}$) or ammonium ion ($NH_4^+$), etc., adheres to the surfaces of such parts which are irradiated with the laser light, these ions in a state of being solved in water circumferentially existing are activated by the irradiation light, whereby ammonium sulfate (($NH_4)_2SO_4$) is created in the proximity of the incident end face 9c. The created ammonium sulfate adheres to the incident end face 9c, and then, using it as a core, crystalline ammonium sulfate is considered to grow thereon. If ammonium sulfate adheres to the incident end face 9c, laser light is prevented from entering the optical fiber 9; as a result, the transmission efficiency of the optical fiber 9 is decreased, and laser light outputted from the optical fiber 9 is reduced.

In FIG. 2 to FIG. 4, adhesion amounts of sulfate ions and ammonium ions on the receptacle 10, the ferrule 11 and the second lens tube 8 are represented. The adhesion amounts are measured by weight μg per piece. The data is obtained by quantitatively analyzing, using a chromatographic method, liquid solution obtained after each of the parts before being applied to the light source device has been boiled for 4 hours in pure water. In each of the figures, comparison examples for comparing with practical examples corresponding to this embodiment are additionally represented.

Data in cases is represented in FIG. 2, in which, as the receptacle 10, machined brass on which nickel plating is performed is used (Comparison example 1), the machined brass on which the nickel plating is not performed is used (Practical example 1), machined SUS303 is used (Comparison example 2), and machined SUS304 is used (Comparison example 3). In Comparison example 1 where the nickel plating is performed, analysis values of 0.38-0.46 μg/piece of sulfate ions, and 0.23-0.30 μg/piece of ammonium ions were obtained. In Practical example 1, analysis values less than 0.05 μg/piece of sulfate ions, and 0.06-0.10 μg/piece of ammonium ions were obtained. In Comparison example 2 of SUS303, analysis values of 62-87 μg/piece of sulfate ions, and less than 0.05-0.17 μg/piece of ammonium ions were obtained. In Comparison example 3 of SUS304, an analysis value of 1.8-1.9 µg/piece of sulfate ions, and 0.12-0.16 µg/piece of ammonium ions were obtained.

It is considered that the reason why the amounts of sulfate ions in the SUS materials were relatively high is because of sulfur components included in the materials having been solved from the surfaces thereof into the pure water. According to the JIS standard, lower than approximately 0.15 percent (1500 ppm) of the sulfur component is included in SUS303, while lower than approximately 0.03 percent (300 ppm) of the sulfur component is included in SUS304; therefore, it is considered that the difference between the amounts of sulfate ions is caused by that between the sulfur contents in them. The fact that a sulfur component is detected as adhesion material only if the sulfur component is included as a portion of the components constituting the material is considered to be unknown. As a basis that it has not been known, for example, Patent Document No. WO-2000/042639 can be cited in which SUS material is specified to be used from a viewpoint of preventing ammonium sulfate formation. According to the above analysis, in order to ensure the drive life time of the light source device for 3000 hours, as described above, it is considered to be needed that the content of the sulfur component of the fundamental element is reduced to 30 ppm (0.003 percent) or less, which is one order smaller than that of SUS304; moreover, in order to ensure the time for 30000 hours, it is considered to be needed that the content is reduced to 5 ppm or less. Here, when the machined brass on which nickel plating is not performed has been used for the receptacle 10, only the amount of 0.05 µg/piece of sulfate ions has been detected. Here, the machined-brass receptacle 10 represented as Practical example 1 in FIG. 2 was washed, with a chlorinated solvent and acetone, by a washing method described later. In Comparison example 1 in which the nickel plating is performed, although the sulfur component included in the constituent parts is relatively less, the analysis value of sulfate ions was a high level. Accordingly, it has been found to be needed that not only brass material itself is used, but also its surface is exposed without processing the surface by nickel plating, etc.

Obviously from FIG. 3, in analysis data of the nickel-plating machined-brass ferrule 11 (Comparison example 4), the amounts of sulfate ions and ammonium ions each remarkably vary between 0.12 and 12 µg/piece, and between less than 0.05 and 4.6 µg/piece, respectively. The reason is because solution including nickel sulfate and ammonium ions is used in the step of performing nickel plating, and its plating agent is not completely washed away but remains. It is considered that, because the sizes of the core portion 9a and the clad portion 9b of the optical fiber 9 to which the ferrule 11 used here is mounted are in the order of several-hundred µm to 1 mm, even though the washing of the ferrule 11 was performed using ultrasonic waves, etc., the plating agent may have not sufficiently washed off, and the data has varied. Regarding the ferrule 11, processing agents such as the plating solution may remain at the hole, for passing through the optical fiber 9, and on side surfaces where concave/convex shapes are formed; accordingly, it is practically difficult to remove the agents and check the removal for all parts, considering the cost effectiveness. The reason why the minimum amount of attached sulfate ions in Comparison example 4 is 0.12, which is smaller than that in Comparison example 1, is because the surface area of the ferrule 11 is smaller than that of the receptacle 10. On the other hand, in Practical example 2 where the brass material itself was used without nickel plating, the amount of sulfate ions was less than 0.05 to 0.07 µg/piece and the amount of ammonium ions was 0.06 to 0.12 µg/piece, in which both values were at lower levels than those where the nickel plating was performed.

FIG. 4 shows analysis results of the second lens tube 8, in which material of aluminum die casting ADC12 (JIS standard) is used in Comparison example 5, and machined material of aluminum A5052 (JIS standard) is used in Practical example 3. In the results of Comparison example 5 where the aluminum die casting is used as the second lens tube 8, a sulfate-ion amount of 0.28 to 0.60 µg/piece and an ammonium-ion amount of 0.58 to 0.80 µg/piece are detected. Because an area of portions which are irradiated with relatively high-intensity reflection and scattering light is approximately one third of all areas, considering only the portions to be irradiated, it can be considered to be in the orders of 0.1 to 0.2 µg/piece of sulfate ions and 0.2 to 0.3 µg/piece of the ammonium ions which are one third of the respective detected amounts. It was found in this study that the reason why sulfate ions are detected in the die casting parts is because the sulfate ions are included in a mold release agent for releasing the parts from their respective molds. It was found that, conversely, if sulfate ions are not included in the mold release agent or the die-casting configuration element, the die-casting method with an advantageous cost performance can be applied to mass production.

In FIG. 4, in the case of Practical example 3 where the machined aluminum material is applied instead of the aluminum die casting, the amount of sulfate ions is less than 0.1 µg/piece, while that of ammonium ions is 0.42 to 0.64 µg/piece. Because an area of portions which are irradiated with relatively high-intensity reflection and scattering light is approximately one third of all areas, considering only the portions to be irradiated, it can be considered to be approximately in the orders of 0.03 µg/piece of sulfate ions and 0.14 to 0.21 µg/piece of the ammonium ions which are one third of the respective amounts. It is considered that the reason why, although the surface area of the second lens tube 8 is relatively wider comparing with that of the receptacle 10, etc., the values are relatively small is because, due to no protrusion, etc., on the surface, even if sulfate ions adhere thereto, they can be easily washed away.

Considering the above test results represented in FIG. 2 to FIG. 4, the amounts of sulfate ions and ammonium ions attached to each of the constituent parts were targeted to values that can be surely achieved at the practical mass-production level, that is, amounts less than 0.1 µg/piece of sulfate ions and less than 0.2 µg/piece of ammonium ions. Here, because the radius of the second lens tube 8 is 1.46 cm, the tube height is 3.94 cm, and the surface area inside the tube is 42.84 $cm^2$ obtained from the sum of the cross-sectional area of the tube and the surface area of the cylindrical portion, the target values for the second lens tube 8 can be represented as 2.3 $ng/cm^2$ or less of a specified sulfate-ion amount and not more than 4.7 $ng/cm^2$ or less of a specified ammonium-ion amount which are obtained by dividing sulfate ion amount and the ammonium-ion amount by the surface area inside the tube.

FIG. 5 represents results of examining washing processes for the ferrule 11 formed by machining brass, in which sulfate-ion amounts and ammonium-ion amounts adhering to the ferrule 11, just after the machining (Comparison example 6), after washing with a chlorinated solvent (Comparison example 7), and after washing with acetone (Practical example 4) are represented.

Dichloromethane ($CH_2Cl_2$), or trichloroethane ($C_2HCl_3$), etc., is used as the chlorinated solvent. The washing with the chlorinated solvent is performed by a triple-bath washing method. For example, a vapor bath in which a chilled target to be washed is placed in solvent vapor and the vapor is liquefied on the surface of the target, a cooling bath into which liquid distilled by the vapor bath flows, and a pre-washing bath into which liquid overflowing from the cooling bath flows are prepared. Then, washing is performed for 30 to 60 seconds (for example, 40 seconds) by a vertical shaking operation in the pre-washing bath (first bath), ultrasonic washing at 45 kHz is performed for 30 to 60 seconds (for example, 40 seconds) in the cooling bath (second bath) keeping its temperature at 15 plus/minus 10 degrees C., and washing with liquid distilled by the vapor bath (third bath) keeping its temperature at 43 degrees C. or lower is performed for 30 to 60 seconds (for example, 40 seconds). Especially, regarding the vapor bath, because impurities are not included in vapor, the surfaces of the parts can always be washed with clean liquid. Here, the temperature of each bath is not limited to the above-described temperatures, but can be varied depending on the solvent to be used. The washing with acetone is performed in such a way that the part to be washed is submerged into acetone served in a beaker, and then washed by ultrasonic waves for 5 to 30 minutes at a frequency of approximately 22 to 50 kHz.

In Comparison example 6 just after the machining, the sulfate-ion amount of 2.2 to 2.8 μg/piece and the ammonium-ion amount of 0.12 to 0.14 μg/piece were detected. The reason why the amount of sulfate ions is relatively large at this time is because sulfur components included in machine oil have adhered to the ferrule 11. As a result of the washing operation with the chlorinated solvent for removing these sulfur components, in Comparison example 7, the sulfate-ion amount reduction to 0.11 to 0.15 μg/piece has been achieved, which is one order of magnitude lower than that in Comparison example 6; however, the ammonium-ion amount has been little changed. Because, in FIG. 5, after the washing operation using the chlorinated solvent, by further washing using acetone, each of the ion amounts is reduced to half thereof, it is found to be effective to additionally wash with acetone. As described above, when amounts of 0.1 μg/piece or less of sulfate ions and 0.2 μg/piece or less of ammonium ions are set as desired washing levels, the additional washing operation is effective.

Here, although the result of using the chlorinated solvent is represented in the above washing process, similar effects can be obtained when a brominated solvent is used instead of the chlorinated solvent. The additional washing agent is not limited to acetone. It is also effective to wash with alcohol such as methanol or ethanol, or by pure water.

According to the above investigation result of examining the washing process, it has been clarified that, when material elements including no sulfur component are used, the main factor of sulfate-ion adhesion is caused by adhesion of machining oil or abrasive, etc., in the processing of the material elements. If processing agents including no sulfur component are used in the processing, the amount of sulfate ions can be reduced by one order in the result just after machining. In this case, even if the additional washing operation is not performed, 0.1 μg/piece or less of the sulfate-ion amount and 0.2 μg/piece or less of the ammonium-ion amount to be target values can be securely achieved.

Figure 6:
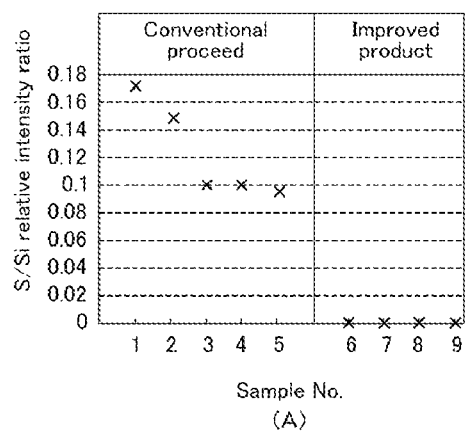
FIG. 6 includes graphs representing relative amounts of sulfur (S) and nitrogen (N) adhering on an incident end face of a fiber.
Figure 6:
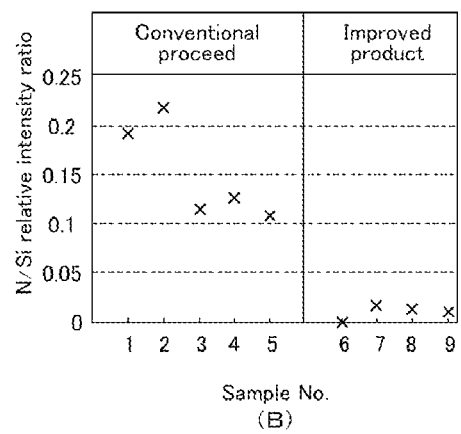

Next, a result is represented in which a comparison test, from the viewpoint of preventing the adhesion of sulfate ions and the ammonium ions onto the incident end face 9c, is performed on a light source device having the ferrule 11 and the receptacle 10 on which the nickel plating is performed, and the second lens tube 8 using the aluminum die casting (conventional product), and on a light source device having the ferrule 11 and the receptacle 10 using the machined brass and the second lens tube 8 using the machined aluminum (improved product). The test has been performed, using as the LD 1 a light source emitting blue region light having the wavelength of 430 to 450 nm, under a radiation condition of approximately 1 W of the average laser output power, and approximately 150 μm of the focus diameter (average energy density is approximately 5.6 kW/cm$^2$) for 240 hours. FIG. 6(A) and FIG. 6(B) represent results in which the sulfur component and the ammonium component, respectively, adhering to the incident end face 9c of the conventional and the improved products are analyzed by a fluorescent X-ray analysis method, and the data is represented as relative intensity against silicon (Si) detected from the surface of the optical fiber 9.

As is obvious from the results represented in FIG. 6(A) and FIG. 6(B), while in the conventional product using the nickel plating and the die casting, relative amounts of the sulfur component and the ammonium component each are detected at a level around 0.1 or higher, in the improved product in which the adhesion amounts are controlled and the machined material is used, each of the values is less than 0.01; thus, the values lower than the substantially detectable limit have been obtained.

Successively, continuous current flow was performed for a period exceeding 6,000 hours using the conventional light source device and the device to which the present invention is applied. While in the conventional product, clouding due to the adhesion of sulfate ions was obviously observed on the incident end face 9c, and output power passing through the optical fiber 9 was reduced, in the improved product using the machined aluminum second lens tube 8, neither adhesion nor clouding was observed on the incident end face 9c, and the transmission characteristics of the optical fiber 9 were also confirmed not to have been varied. Here, according to estimation of the adhesion amount on the optical parts configuring the light source device, it was found that the adhesion can be detected if the energy density is higher than approximately 100 W/cm$^2$, which is $1/50$ of the average energy density (approximately 5.6 kW/cm$^2$) of the laser light outputted from the light source.

Continuous current flow was performed for 70 hours using an improved product, where only the receptacle material was changed to SUS304. Adhesion and clouding were observed on the incident end face 9c of this improved product. According to this observation, it has been confirmed that sulfate ions adhere to the incident end face 9c in a case of the sulfur component being included as a configuration component of constituent parts.

A method is proposed in Japanese Patent Application Publication Laid-Open No. 2004-253783 in which an optical system and an incident face of a fiber are hermetically sealed by an inert gas such as a rare gas, nitrogen, or dry air so as not to be in contact with an environmental impurity gas; however, this method produces rather opposite effects in systems where contamination due to a minute amount of ions adhering configuration elements is viewed as a problem; therefore, a system is desirable that the hermetic sealing is not performed intentionally, but that includes spaces generated by a general assembly process so that the hermetic sealing is not performed.

Because a conventional main problem for light sources emitting laser light in an ultraviolet wavelength region has been to remove $SO_2$ or $NH_3$ in an atmosphere, means for hermetically sealing in impurity gases surrounding optical parts, exchanging them into an inert gas such as rare gas, $N_2$, or dry air by a gas flow operation, etc., or vacuuming them are taken. However, because light in a visible region of 400 nm to 780 nm has photon energy lower than that of general chemical bonding, the light cannot in principle dissociate impurity gas molecules in a relatively low-output-power region, i.e., the average output power is watt-class; therefore, influence of the impurity gases included in air is considered to be distinctly less comparing to that of an ultraviolet wavelength region (lower than 400 nm). In such a wavelength region, influence of sulfur components included in parts configuring optical parts or supporting them, or in their surrounding parts, or of sulfate ions and ammonium ions adhering thereto is considered to be significant. Therefore, the light source device according to Embodiment 1 is especially effective to a case where visible-region light is emitted from the light source.

In Embodiment 1, although it has been explained that the sulfate-ion amount can be reduced by not plating the receptacle 10 and the ferrule 11 with nickel, it is desirable that the materials are barely exposed without any surface treatment such as nickel plating, alumite treatment, and chemical conversion treatment.

According to the light source device of Embodiment 1, because the optical parts on which light whose light density is relatively high is incident, their supporting parts and the housing, or their surrounding optical parts receiving reflection and scattering light from the incident faces have been made so as not to include sulfur components, and the adhesion amounts of sulfate ions and the ammonium ions forming ammonium sulfate have been reduced to a value lower than the specified values, the adhesion of ammonium sulfate onto the optical parts can be reduced, and constant optical transmission characteristics and scattering characteristics can be ensured in a maintenance-free state; as a result, the operation can be stabilized for a long period, and the reliability can be improved.

Embodiment 2

Figure 7:
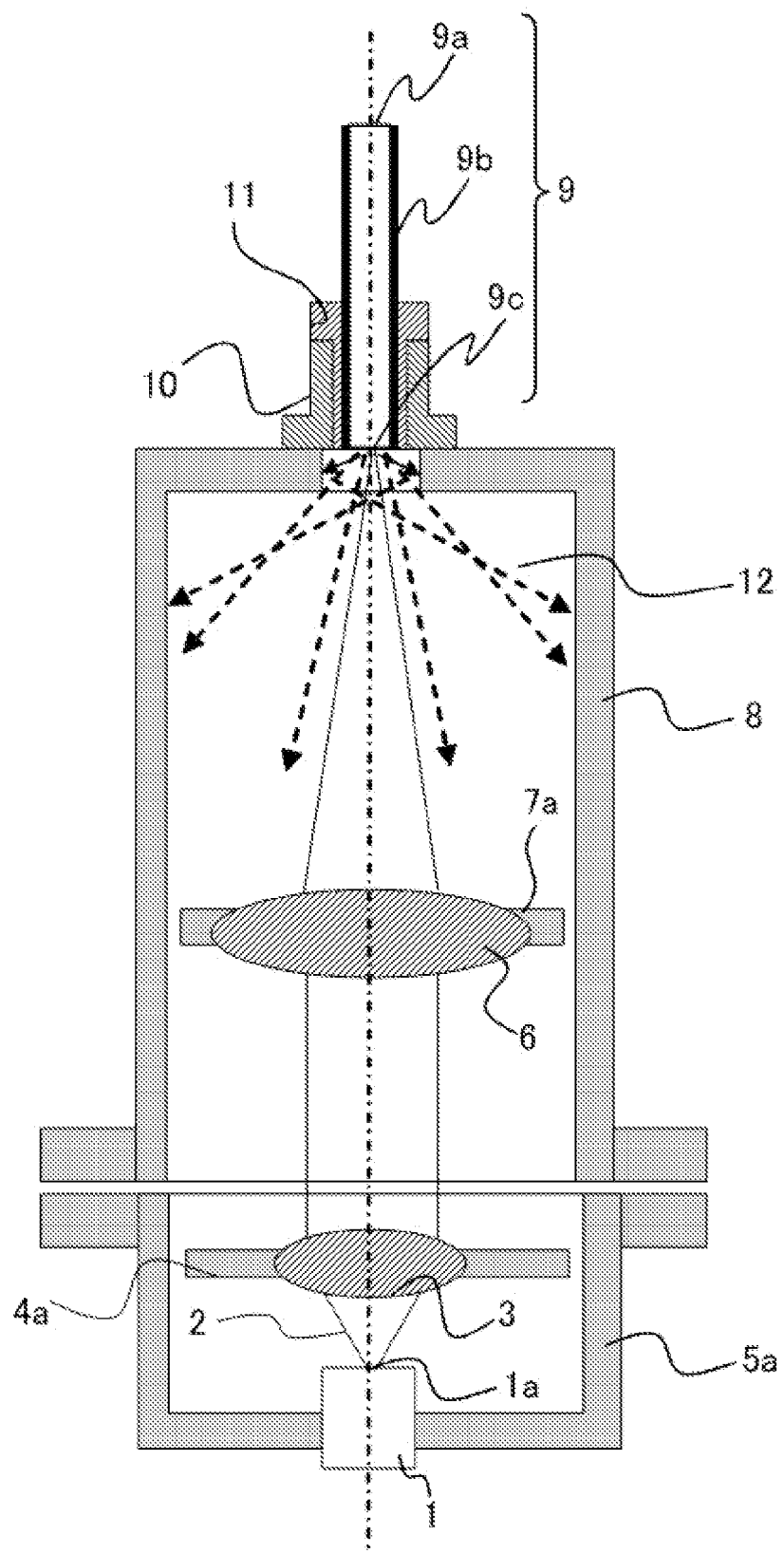
FIG. 7 is a configuration view illustrating a light source device according to Embodiment 2 of the present invention.

FIG. 7 is a view illustrating a light source device according to Embodiment 2. In Embodiment 1, regarding the ferrule 11, the receptacle 10, and the second lens tube 8, the example has been explained in which they are configured of material including no sulfur such as brass, without using the nickel plating, the alumite treatment, and the die casting; however, in FIG. 7, a first lens holder 4a, a second lens holder 7a, and a first lens tube 5a are also configured of material including no sulfur component, such as brass, basically without using plating, alumite-treatment, and die-casting. In FIG. 7, regarding the same components as those in FIG. 1, the same symbols are given, and their explanation is omitted.

Basically, material that includes no sulfur component is necessary to be used as members around the incident end face 9c at which the laser light is focused, that is, as members at which the light density of the laser light is relatively high; however, in order to relatively extend the time needed until clouding occurs on the incident end face 9c, considering cost performance, other constituent parts are also needed to be formed by materials including no sulfur component. Especially, in a system in which the output power of the LD 1 exceeds 10 W, the energy densities of the laser light incident on the second lens 6 and the first lens 3 are relatively high. Therefore, materials including no sulfur component are desirable to be used for all parts.

Needless to say, also in a case of a plating product, a die-casting product and an alumite-treatment product being used for some of the parts, the effectiveness of Embodiment 2 is not impaired. The sulfate-ion amount or the ammonium-ion amount can be reduced for the amount of replacements from the conventional configuration to materials, such as aluminum and brass including no sulfur component, in which plating, alumite-treatment and die-casting are not used, whereby the time constant until their adhesion on the incident end face 9c of the fiber or other optical parts is extended; as a result, the output from the light source device can be stabilized, and the reliability can be improved.

Embodiment 3

Figure 8:
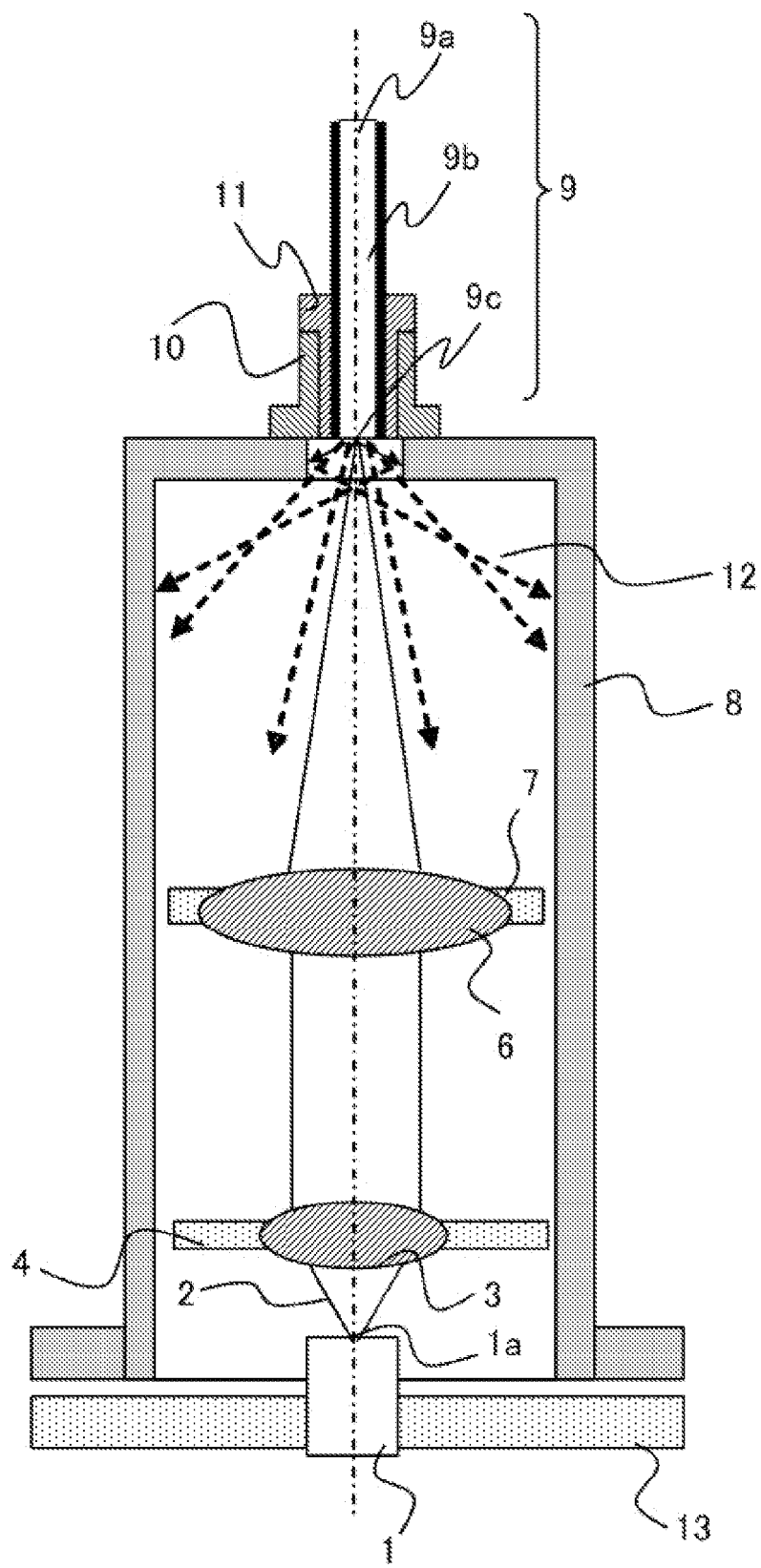
FIG. 8 is a configuration view illustrating a light source device according to Embodiment 3 of the present invention.

FIG. 8 is a structural view illustrating another embodiment according to the present invention. In FIG. 8, regarding the same components as or the corresponding components to those in FIG. 1, the same symbols are given, and their explanation is omitted. An LD holder 13 supports LD 1.

In FIG. 8, the first lens 3 and the first holder 4 are placed in the second lens tube 8. The LD 1 is supported by the LD holder 13. In this manner, even though both the first lens 3 and the second lens 6 are placed in the same second lens tube 8, such a configuration is also included in the present invention. Basically, it is a point that at least the members around the incident end face 9c on which laser light having relatively high density is incident, such as the first lens tube 8, the receptacle 10 and the ferrule 11, are configured of material including no sulfur component, such as aluminum and brass, in which plating, alumite-treatment and die-casting are not used.

Figure 9:
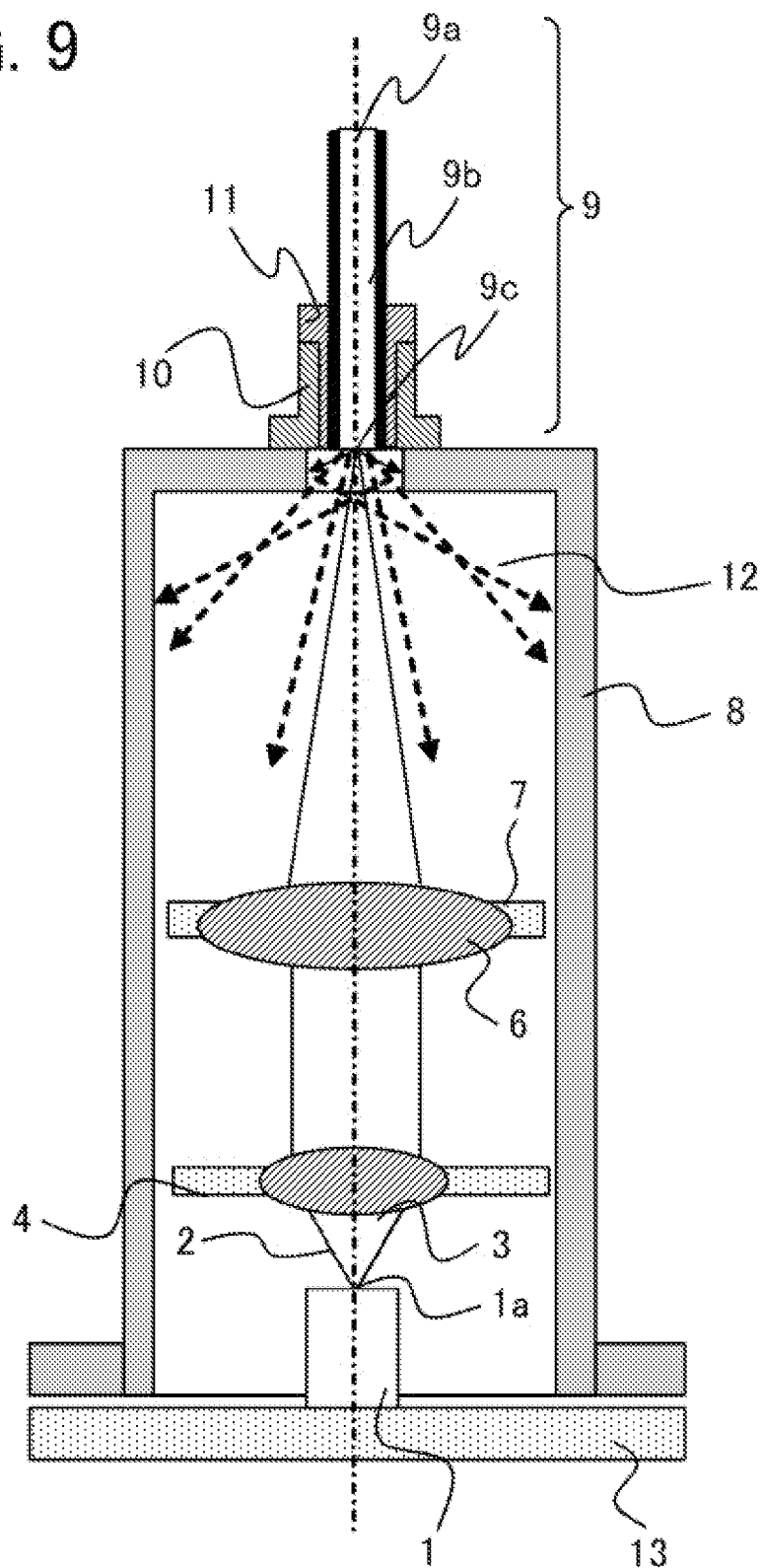
FIG. 9 is a configuration view illustrating another example of the light source device according to Embodiment 3 of the present invention.

The LD 1 is described to have a structure supported by the LD holder 13; however, actually, there may be a case where the optical axis of the laser light 2 is needed to be adjusted with those of the first lens 3 and the second lens 6, in such a case, an optical-axis adjusting system for adjusting the optical axis by moving the LD 1 with respect to the LD holder 13 is needed. In FIG. 8, although the LD 1 is structured to penetrate the LD holder 13, it can also be structured to be arranged on the LD holder 13 as represented in FIG. 9.

Embodiment 4

In FIG. 1, FIG. 7, FIG. 8 and FIG. 9, the first lens 3 and the second lens 6 each are configured of a single lens; however, in actual design, from a viewpoint of both the ensuring of needed optical-system power and the reduction of optical aberration, each of the lenses can also be configured by combining a plurality of lenses. Also in such a case of the configuration, by configuring the elements which are irradiated with laser light having relatively high density energy using materials including no sulfur component, such as aluminum and brass, in which plating, alumite-treatment and die-casting are not used, clouding of the optical parts can be reduced.

Embodiment 5

Figure 10:
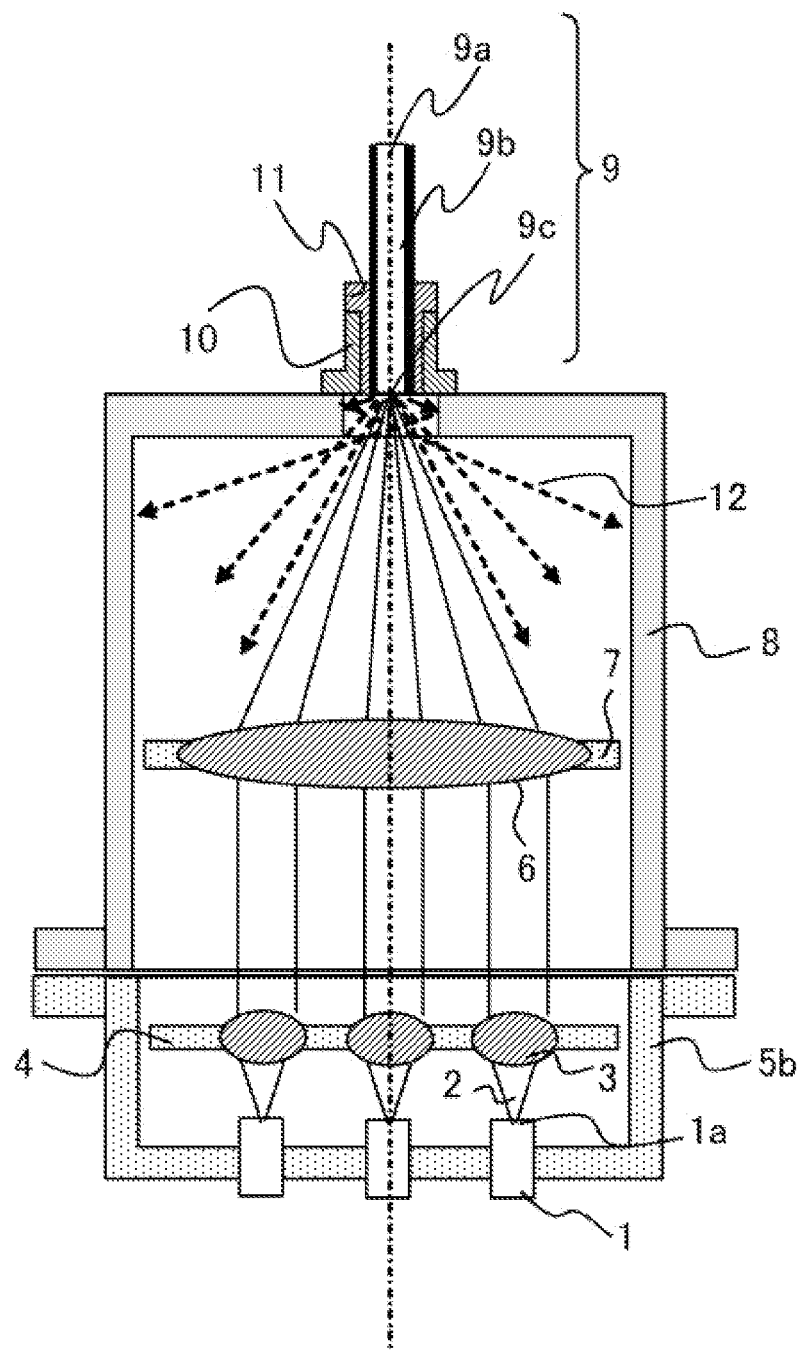
FIG. 10 is a configuration view illustrating a light source device according to Embodiment 5 of the present invention.

FIG. 10 is a configuration view illustrating a light source device according to another embodiment of the present invention. In FIG. 10, regarding the same components as or the corresponding components to those in FIG. 1, the same symbols are given, and their explanation is omitted. In FIG. 10, a plurality of LDs 1 is provided and a plurality of first lenses 3 is arranged corresponding to the LDs 1, the plurality of LDs 1 is arranged in a first lens tube 5b.

Next, an operation of the light source device represented in FIG. 10 is explained. The plurality of LDs 1 is arranged in the first lens tube 5b, and optical axes of laser light 2 emitted from the LDs 1 are arranged approximately in parallel to each other within a permissible range with respect to the second lens 6 and the plurality of first lenses 3. In a system arranged as described above, because the laser light 2 emitted from each of the LDs 1 almost focuses on a focal plane of the second lens 6, by arranging the incident end face 9c of the optical fiber 9 in the proximity of the focal point, the laser light 2 emitted from each of the LDs 1 can be inputted into the single optical fiber 9. Accordingly, if n sets of LDs 1 are used, the intensity of the laser light can be increased to n times thereof. If the intensity of the laser light is increased to n times, the light density of the laser light incident on the surrounding parts of the incident end face 9c is also increased; however, by configuring these parts not using plating, alumite-treatment or die-casting, but using materials such as aluminum and brass that includes no sulfur component, clouding of the optical parts provided at portions where the incident light density is relatively high can be reduced.

Embodiment 6

Figure 11:
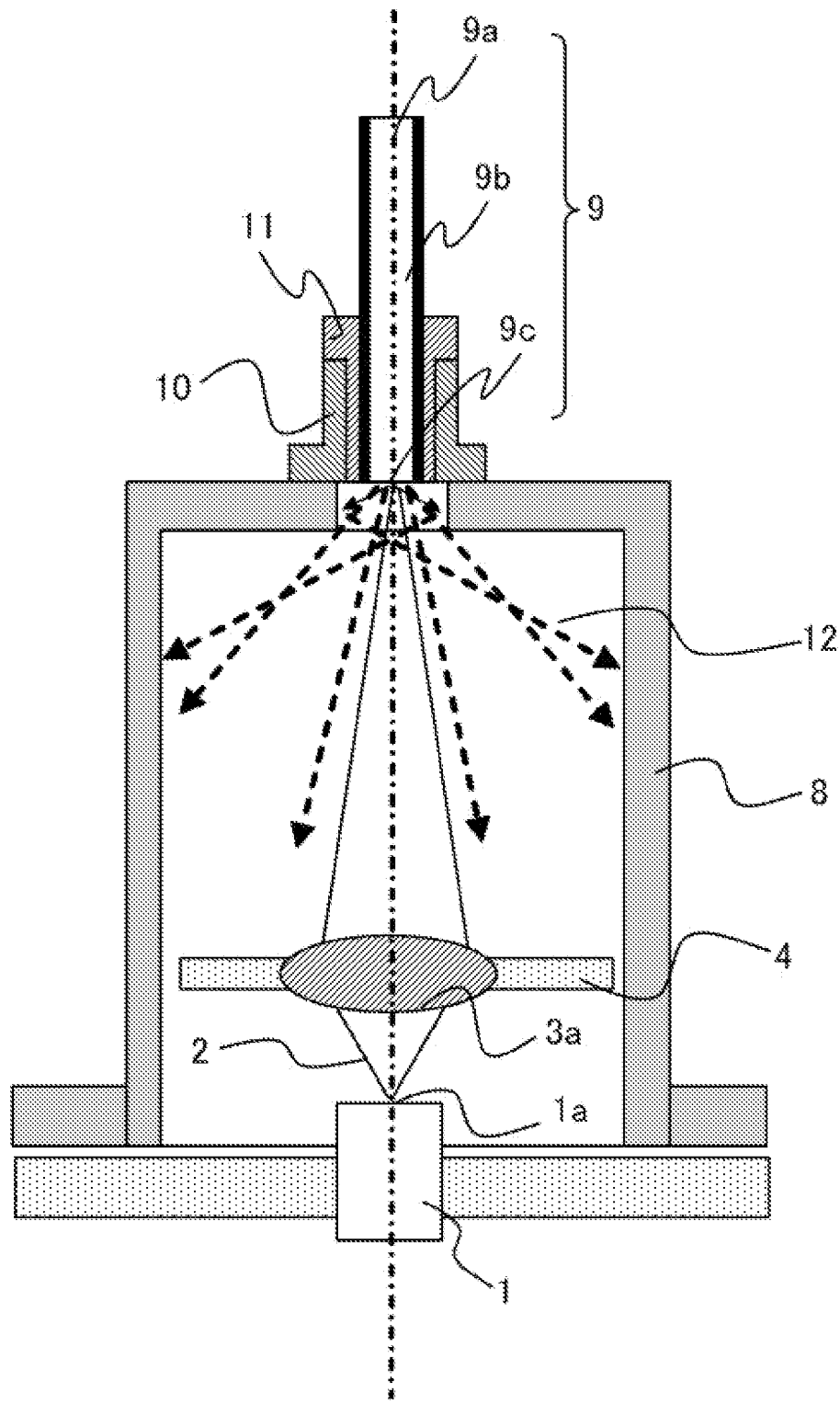
FIG. 11 is a configuration view illustrating a light source device according to Embodiment 6 of the present invention.

FIG. 11 is a configuration view illustrating a light source device according to another embodiment of the present invention. In FIG. 11, regarding the same components as or the corresponding components to those in FIG. 1, the same symbols are given, and their explanation is omitted.

In FIG. 11, the light source device is configured in such a way that the laser light 2 emitted from the LD 1 is focused by a first lens 3a, and inputted into the optical fiber 9. This configuration is an example of a lens configuration different from those in the light source devices according to Embodiments 1 to 5. The present invention is not limited to this example, but another lens configuration can also be adopted.

Embodiment 7

Figure 12:
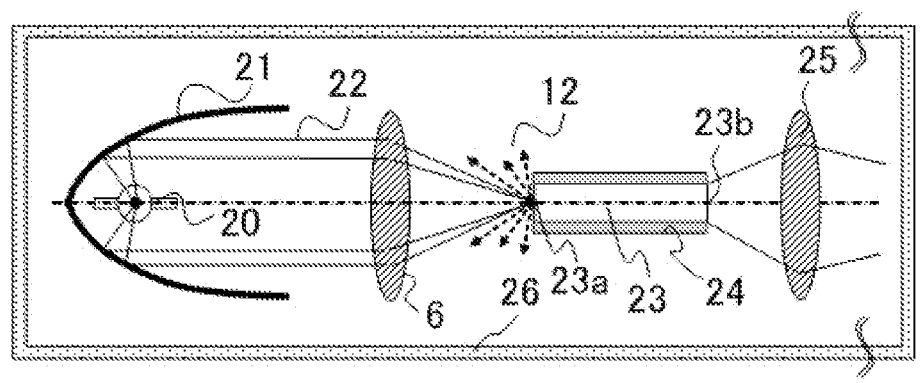
FIG. 12 is a configuration view illustrating a light source device according to Embodiment 7 of the present invention.

FIG. 12 is a configuration view illustrating a light source device according to another embodiment of the present invention. In FIG. 12, the light source device is configured with a lamp light source 20, a curved mirror 21 for collimating light emitted from the lamp light source 20 to form lamp light 22, a waveguide 23 for homogenizing light inputted thereinto, a waveguide holder 24 for supporting the waveguide 23, a third lens 25 for transcribing into a display device such as a liquid-crystal panel or relaying, a state of a light-exiting end face 23b of the waveguide 23, and a housing 26.

The light source device represented in FIG. 12 is applied to a light source of a so-called projection-type display device. Here, an operation of the device represented in FIG. 12 is explained.

Light emitted from a light emitting spot, of the lamp light source 20, whose size is controlled approximately to 1 mm is collimated by the curved mirror 21. The curved mirror 21 is a collimating unit for collimating light emitted from the light source. For example, when the curved mirror 21 is elliptically formed, by positioning the light emitting spot of the light source 20 at the focal point of the elliptical mirror, the light emitted from the light source 20 can be formed to almost parallel light. The lamp light 22 exited from the curved mirror 21 is focused by the second lens 6. By positioning an incident end face 23a of the waveguide 23 close to the focal point of the second lens 6, the lamp light 22 can be effectively guided into the waveguide 23. Light exited from this waveguide 23 can be formed to be homogeneous by suitably designing an incident spread angle of the lamp light 22, and the cross-sectional shape and length of the waveguide 23. By transcribing into the display device such as the liquid-crystal panel or relaying, using the third lens 25, a state of the light-exiting end face 23b from which the homogenized light is exited, the entire light source device functions as a homogenized light source for the display device. Here, by using aluminum or brass material including no sulfur component as material configuring the wave guide holder 24, and by controlling adhesion amounts of sulfate ions and ammonium ions, producing of the sulfate ions and the ammonium ions, etc., by light scattered from the incident end face 23a can be suppressed. In a system in which the intensity of light emitted from the light source 20 is relatively high, ammonium sulfate, etc., may adhere to the second lens 6 or the third lens 25. In such a system, by configuring, using material including no sulfur component, other constituent parts such as the housing 26 configuring the light source device in addition to the holders for the lenses, and by controlling adhesion amounts of sulfate ions and ammonium ions, the adhesion of ammonium sulfate, etc., on the second lens 6 or the third lens 25 can also be prevented.

Embodiment 8

Figure 13:
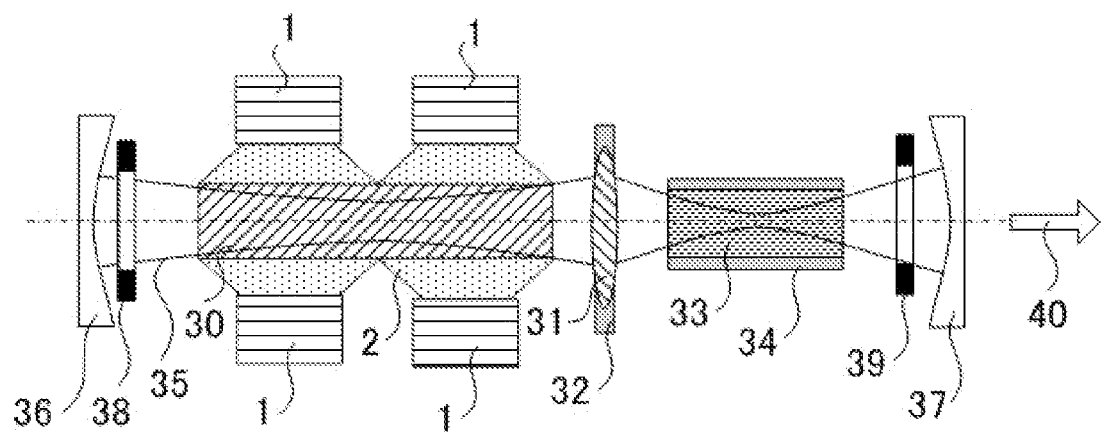
FIG. 13 is a configuration view illustrating a light source device according to Embodiment 8 of the present invention.

FIG. 13 is a configuration view illustrating a light source device according to another embodiment of the present invention. The light source device represented in FIG. 13 is configured with excitation LDs 1 for emitting laser light 2 as excitation LD light having, for example, 808 nm of the wavelength region, a solid-state laser crystal 30 such as Nd:YAG and Hd:YVO$_4$, a coupling lens 31 for focusing laser light 35, a coupling-lens holder 32 for supporting the coupling lens 31, a wavelength conversion crystal 33 such as KTP (KTiOPO$_4$) crystal, BBO (β-BaB$_2$O$_4$) crystal and LBO (LiB$_3$O$_5$) crystal for converting laser light, having the wavelength of 1064 nm, generated by the solid-state laser into that whose wavelength is 532 nm as its second harmonic wave, a wavelength-conversion-crystal holder 34 for supporting the wavelength conversion crystal 33, a total reflection mirror 36, an extraction mirror 37 having characteristics to reflect all the 1064 nm light and transmit the 532 nm light, and apertures 38 and 39 for determining the mode of the laser light. Laser light 40 having the wavelength of 532 nm exits from the extraction mirror 37 of the light source device. Here, each of the constituent parts is housed in a housing not illustrated.

Regarding the configuration of the light source device represented in FIG. 13, the device is configured to be a so-called wavelength-conversion-type LD-excitation solid-state laser. Next, an operation is explained. By irradiating the solid-state laser crystal 30 with the laser light 2 emitted from the LDs 1, Nd$^{3+}$ doped in the solid-state laser crystal 30 is excited, and due to stimulated emission the energy is outputted as laser light 35 having the wavelength of 1064 nm. In the wavelength conversion crystal 33, by suitably setting an incident angle and the temperature of the wavelength conversion crystal so that the 1064 nm laser light 35 satisfies a phase matching condition with its second harmonic light, the laser light is effectively converted to green light having the wavelength of 532 nm. The total reflection mirror 36 and the extraction mirror 37 constitute a so-called optical resonator, which operate laser oscillation having the wavelength of 1064 nm, and in which the 532 nm laser light 40 is basically outputted from the extraction mirror 37. Light exiting therefrom is laser light basically having a single transverse mode due to the apertures 38 and 39.

Here, because, from a viewpoint of increasing the wavelength conversion efficiency, focused high-intensity green light is generated in the wavelength conversion crystal 33, if at least the wavelength-conversion-crystal holder 34 is not configured of suitable material, ammonium sulfate precipitates at an end face of the wavelength conversion crystal 33. However, because the wavelength-conversion-crystal holder 34 is configured of material such as aluminum or brass basically including no sulfate component, the precipitation of ammonium sulfate at the end face of the wavelength conversion crystal 33 can be reduced; as a result, a stable wavelength-conversion-type solid-state laser can be realized. Moreover, regarding the coupling-lens holder 32 for supporting the coupling lens 31, because the light intensity of the laser light emitted is relatively high, by constructing it using material such as aluminum or brass basically including no sulfate component, a time constant until ammonium sulfate adheres to the coupling lens 31 can be extended. Also, regarding holders for supporting the other optical parts, by constructing them using material such as aluminum or brass basically including no sulfate component, a time constant until ammonium sulfate adheres to the supported optical parts can be extended.

It is needless to say that, regarding a system, such as a filter and a spectroscopic optical prism generally used as other optical parts, on which light having relatively high optical density is incident, by constructing its components using material such as aluminum or brass basically including no sulfate component, adhesion of adhesives onto the optical parts and clouding of the optical parts can be prevented.

What is claimed is:

1. A light source device comprising:
   a semiconductor laser element for emitting laser light;
   an optical part for processing light emitted from the semiconductor laser element, the optical part including at least one lens focusing the light emitted from the semiconductor laser element; and
   a housing in which the optical part is housed, or to which the optical part is mounted,
   the housing being formed by machining material that includes no sulfur component, and the material being exposed on the surface thereof, wherein an amount of sulfate ions and ammonium ions adhering to the housing are 2.3 ng/cm$^2$ or less and 4.7 ng/cm$^2$ or less, respectively,
   wherein the material including no sulfur component is any one of brass, titanium, ceramics, and resin.

2. A light source device as recited in claim 1, further comprising a holder for supporting the optical part, wherein the optical part and/or the holder on which light having an average energy density of 100 W/cm2 or higher is incident are formed by material including no sulfur component.

3. A light source device as recited in claim 1, wherein the housing is machined using machine oil including no sulfur component.

4. A light source device as recited in claim 1, wherein the housing is, after being washed with a chlorinated or brominated solvent, washed with acetone, alcoholic solution, or pure water.

5. A light source device comprising:
   a semiconductor laser element for emitting light;
   an optical part for processing light emitted from the semiconductor laser element, the optical part including at least one lens focusing the light emitted from the semiconductor laser element; and
   a housing in which the optical part is housed, or to which the optical part is mounted,
   the housing being formed by die casting using material that includes no sulfur component, and a mold release agent for releasing the housing from a metallic mold used in the die casting including no sulfur component, wherein an amount of sulfate ions and ammonium ions adhering to the housing are 2.3 ng/cm$^2$ or less and 4.7 ng/cm$^2$ or less, respectively,
   wherein the material including no sulfur component is any one of brass, titanium, ceramics, and resin.

6. A light source device comprising:
   a light source for emitting light;
   a collimating unit for collimating light emitted from the light source;
   a focusing unit for focusing the collimated light;
   an optical fiber into which the focused light is inputted, and through which the inputted light is transmitted; and
   a lens tube in which the focusing unit is housed, and to which the optical fiber is mounted,
   the lens tube being formed by machining material including no sulfur component, and the material being exposed on the surface thereof, wherein an amount of sulfate ions and ammonium ions adhering to the housing are 2.3 n g/cm$^2$ or less and 4.7 ng/cm$^2$ or less, respectively,
   wherein the material including no sulfur component is any one of brass, titanium, ceramics, and resin.

7. A light source device as recited in claim 1, wherein the wavelength of light emitted from the light source is within a range from 400 nm to 780 nm.

8. A light source device as recited in claim 5, wherein the wavelength of light emitted from the light source is within a range from 400 nm to 780 nm.

9. A light source device as recited in claim 6, wherein the wavelength of light emitted from the light source is within a range from 400 nm to 780 nm.

* * * * *